United States Patent [19]

Kuhara

[11] Patent Number: 5,483,096
[45] Date of Patent: Jan. 9, 1996

[54] PHOTO SENSOR

[75] Inventor: Kentaro Kuhara, Tokyo, Japan

[73] Assignee: Seiko Instruments Inc., Japan

[21] Appl. No.: 250,340

[22] Filed: May 27, 1994

Related U.S. Application Data

[63] Continuation of Ser. No. 967,783, Oct. 28, 1992, abandoned.

[30] Foreign Application Priority Data

Nov. 7, 1991 [JP] Japan ................................. 3-291788
Nov. 7, 1991 [JP] Japan ................................. 3-291789

[51] Int. Cl.⁶ .......................... H01L 31/08; H01L 27/14; H01L 23/48; H01L 29/41
[52] U.S. Cl. ...................... 257/462; 257/53; 257/452; 257/436; 257/444; 257/448; 257/451; 257/459; 257/464; 257/640; 257/648; 257/652
[58] Field of Search ................. 257/53, 452, 462, 257/414, 431, 436, 444, 446, 448, 451, 452, 457, 459, 435, 463, 464, 465, 630, 640, 648, 652

[56] References Cited

U.S. PATENT DOCUMENTS 4,794,443 12/1988 Tanaka et al. ................. 257/462
5,065,222 11/1991 Ishii .

FOREIGN PATENT DOCUMENTS 0435309 7/1991 European Pat. Off. ........... 257/446
56-81982 7/1981 Japan ............................ 257/462
63-128666 6/1988 Japan ............................ 257/462
64-71184 3/1989 Japan ............................ 257/462

Primary Examiner—Sara W. Crane
Assistant Examiner—Alice W. Tang
Attorney, Agent, or Firm—Adams & Wilks

[57] ABSTRACT

A photo sensor comprises a semiconductor substrate, a bipolar photo transistor having an emitter region, a base region and a collector region which is formed in the surface region of the semiconductor substrate, a silicon dioxide formed on the bipolar phototransistor, and a film having a smaller diffusion coefficient of hydrogen than the silicon dioxide formed all over the silicon dioxide.

8 Claims, 4 Drawing Sheets

PHOTO SENSOR

This is a continuation application of Ser. No. 07/967,783 filed Oct. 28, 1992 now abandoned.

BACKGROUND OF THE INVENTION

The present invention relates to a photosensor for a semiconductor image sensor device which is used to convert incident radiation energy such as light radiation into electric signals.

Referring to the example using light as an electromagnetic radiation source, the prior art will be explained. FIG. 5 shows a conventional photosensor. A surface of a collector semiconductor substrate 5 of a bipolar transistor is covered with a silicon oxide film 6. When a light 9 is incident into the photosensor, electric charges are accumulated in a portion between a base 2 and a collector 5 and a base potential rises, then a base current flows from the base 2 to an emitter 1. The base current is amplified at a rate of static common-emitter current gain (hereinafter referred to as "hFE") and turns into a collector current IC, which flows from a collector terminal 51 to the emitter 1 via a collector electrode 8 and an emitter electrode 40.

FIG. 2 shows an equivalent circuit of a semiconductor image sensor device which uses a photosensor having the bipolar phototransistor. In FIG. 2, the photosensor shown in FIG. 5 is incorporated in the circuit as P1. When a switch S1 is turned on, the collector current IC is outputted to a capacitor C1 as a current. As an external output, the charges which accumulate in the capacitor C1 are outputted as an output voltage V01.

In order to read the intensity of incident light with this image sensor device, reproducibility and linearity are required of the relationship between an exposure and an output voltage. In FIG. 6, there is shown an emitter-base voltage—hFE characteristic of the conventional photosensor. The hFE changes depending on the base voltage, and is lower in the region in which the base voltage is lower. As the base voltage increases, the hFE becomes higher. Further, as FIG. 6 shows, this emitter-base voltage dependency of hFE is different in each device, and fluctuates even in the same device as time passes.

This phenomenon occurs mainly because carriers generated by light are bonded to surface states which exist in the surface of the base 2 below the silicon oxide film 6 in FIG. 5, and disappear. Therefore, the more surface states that exist, the more the hFE value declines in the region where the base voltage is lower. As most of these surface states are generated chiefly by dangling bonds of a silicon substrate, the dangling bond is restrained by adding hydrogen to it. However, the bonding strength of the hydrogen and the dangling bond is weak, and hydrogen easily diffuses in the silicon oxide film. Therefore, the restraint of the dangling bond with hydrogen is unstable. Moreover, the amount of surface states is different for different devices, and fluctuates by bias in the device, temperature and so on during the operation of a device. As a result, the emitter-base voltage dependency of hFE occurs and the dependency itself changes.

FIG. 7 shows a photoelectric transfer characteristic in the case of using such a conventional bipolar transistor as a photosensor. There occurs a phenomenon that the increased amount of the output voltage is smaller compared with the increased amount of the exposure in the region where the amount of exposure is smaller, and as the exposure increases, the increased amount of the output voltage increases. Further, there is a problem that as shown in FIG. 7 the photoelectric transfer characteristic is different depending on each device.

Therefore, the object of this invention is to obtain a photosensor in which the output voltage does not change by the amount of exposure and in which the increased amount of the output voltage against the increased amount of the exposure does not change depending on the amount of the exposure but is constant.

SUMMARY OF THE INVENTION

In order to solve the above-mentioned problems, this invention has the following structure. In the base surface of the phototransistor, there is provided an impurity layer having a higher concentration than the base and the same conductivity type as the base, and a gate electrode is provided over the surface between the emitter and the base of the high impurity concentration. A silicon oxide film which covers the surface of the phototransistor is covered with a material having a smaller diffusion coefficient of hydrogen than that of the silicon oxide film, for example, silicon nitride film, in order to confine hydrogen in the silicon oxide film.

DESCRIPTION OF THE PREFERRED EMBODIMENTS

Figure 1:
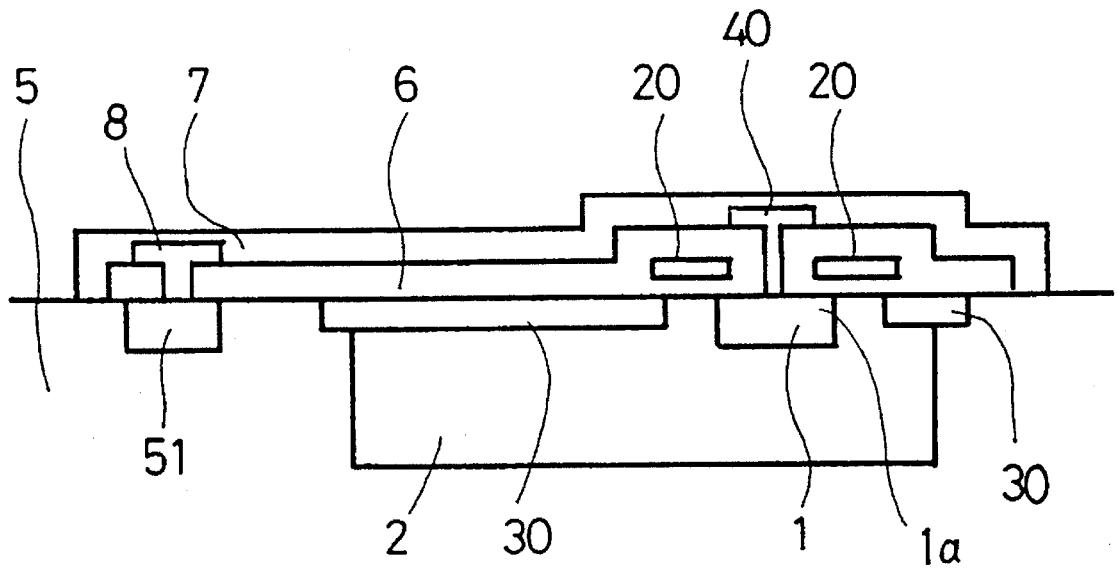
FIG. 1 is a sectional view of the inventive phototransistor for a semiconductor image sensor device.
Figure 2:
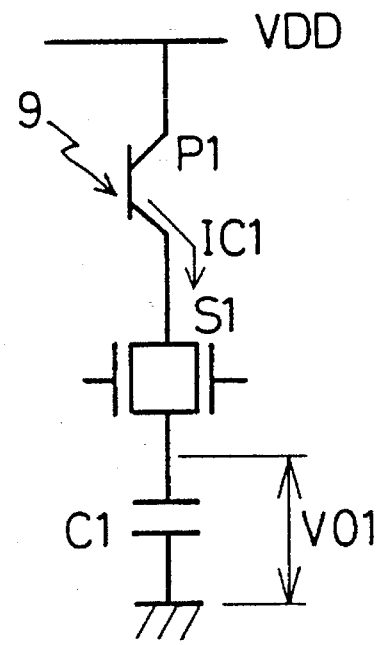
FIG. 2 is an equivalent circuit of the semiconductor image sensor device.

Referring to the drawings, the present invention will be explained in further detail below. FIG. 1 is a sectional view of one embodiment showing the structure of the inventive photosensor. The photosensor comprises a bipolar phototransistor having a collector semiconductor substrate 5 which defines a collector region in which is formed a collector terminal 51 which is connected to a collector electrode 8. A base region 2 is formed in a surface portion of the collector region 5, and an emitter region 1 is formed in a surface portion of the base region 2 and connected to an emitter electrode 40. A gate electrode 20 is provided over the surface of the base region 2 on a peripheral part 1a of the emitter region 1 of the phototransistor.

In a surface portion of the base region 2 at a location spaced from the emitter region 1, there is provided a high concentration base region which is an impurity layer 30 having higher concentration than the base 2 and the same conductivity as the base 2. The distance between the high impurity concentration region 30 and the emitter region 1 is generally shorter than the width of the gate electrode 20. A silicon dioxide film 6 which covers the entire surface of the phototransistor is completely covered with a silicon nitride covering film 7, and the silicon dioxide film 6 is not exposed to the atmosphere at all. Further, hydrogen is confined in the silicon dioxide film 6. In FIG. 1, the covering film for preventing the permeation of hydrogen and which covers the surface of the silicon dioxide film 6 is not limited to one material, but some combinations of plural materials are available.

The base impurity concentration is generally between $1 \times 10^{15}/cm^3$ and $1 \times 10^{17}/cm^3$. Various charges are taken into the silicon oxide film 6, and when the concentration of the base surface is $1 \times 10^{16}/cm^3$ or less, the base surface condition changes under the influence of the electrodes in the silicon oxide film. In case of an N-P-N phototransistor, even if the base concentration is $1 \times 10^{17}/cm^3$, boron is regragated in the interface of the base surface and the silicon oxide film 6. Namely, when the base surface which is made of silicon including boron is oxidized, the concentration of the boron in the surface of the silicon declines since the boron is easier to melt into the silicon oxide film than the silicon. Therefore, the concentration of the base surface declines by a single order of magnitude or more, and is unstable.

In case of a phototransistor, light is intercepted by the base surface and charges generated by the light are accumulated in the base-collector junction, so that the surface area of the base is preferably formed large. Accordingly, if the surface condition is unstable, the accumulation quantity of the charges generated by the light is influenced. Then, the concentration of the base surface is increased in order to stabilize the base surface and thereby to stabilize the amount of accumulated charges. The concentration of the base surface needs to be $1 \times 10^{17}/cm^3$ or more. However, if the high impurity concentration base region 30 and the emitter region 1 come into contact with each other, the emitter injection efficiency declines and the hFE largely decreases. Accordingly, it is necessary to keep the high impurity concentration region 30 of the base region 2 and the emitter region i spaced apart from each other. The distance between the two is such that the depletion layer which extends from the emitter region i to the low concentration portion of the base region 2 should not reach the high impurity concentration base region 30.

As carriers flow toward the emitter region 1, the disappearance of the carriers caused by rebonding of the carriers on the surface occurs the most frequently on the peripheral part 1a of the emitter region 1. The most important cause for rebonding at the surface is surface states. Surface states occur because of the dangling bonds of silicon. This dangling bond occurs when silicon and silicon oxide film are discontinuously bonded. It also occurs when the silicon-to-silicon bond is disconnected because of damage caused by plasma processing during manufacturing steps such as plasma etching and plasma CVD. By providing the gate electrode 20 over a base surface of an interface between the emitter region 1 and the base region 2, the surface can be protected from this plasma, and thereby the surface states can be restricted to a lower level. The same effect can be achieved whether the gate potential of the gate electrode 20 is fixed (constant) or floating.

The dangling bond of silicon cannot be prevented in theory. Therefore, hydrogen is added to the silicon surface and the silicon dangling bond is combined with hydrogen to be electrically deactivated. In the present invention, hydrogen is added into the silicon oxide film 6 and confined in the oxide film by the silicon nitride film 7, so that the bonding of hydrogen is stable.

Figure 8:
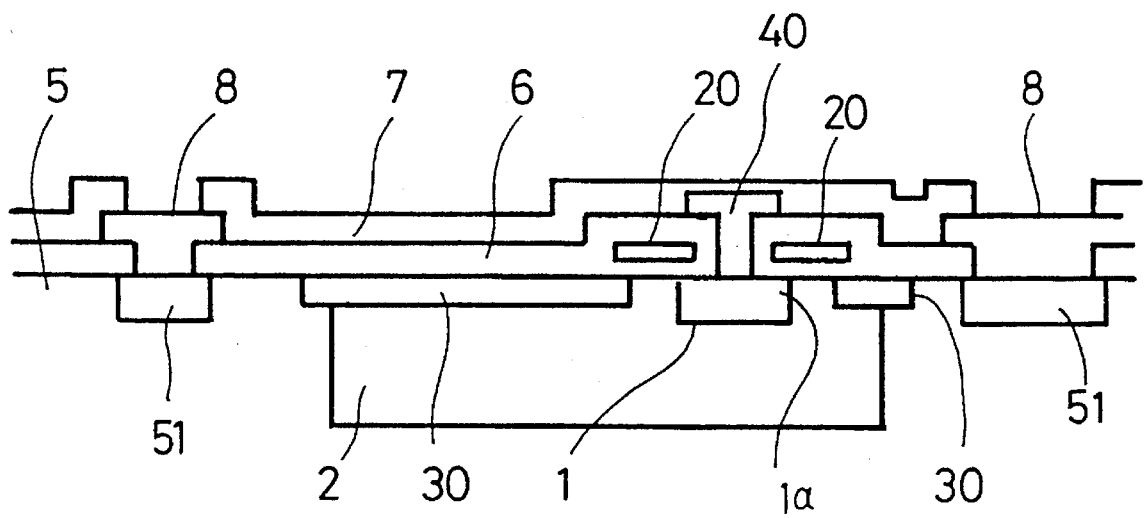
FIG. 8 is a sectional view of another embodiment of the inventive phototransistor for a semiconductor image sensor device.

FIG. 8 shows another embodiment. In FIG. 8, a gate electrode 20 and a high impurity concentration base region 30 are provided in the same manner as in FIG. 1, however, in this embodiment a silicon dioxide film 6 is covered partly by an aluminum wire 8 and partly by a silicon nitride film 7. The silicon oxide film 6 has an upper surface and a sidewall surface, and the wire 8 covers the sidewall surface and part of the upper surface of the silicon oxide film 6 whereas the silicon nitride covering film 7 covers the remaining part of the upper surface. By contrast, in the FIG. 1 embodiment, the silicon nitride film 7 itself completely covers the upper and sidewall surfaces of the silicon oxide film 6. As a result, the hydrogen confined within the silicon oxide film 6 does not escape and is stable. The material of the wire 8 in FIG. 8 produces the same effect if it is made of a film having a smaller diffusion coefficient of hydrogen than that of the oxide film, for instance, polysilicon and silicide.

As to a method for adding hydrogen, it may be added by conventional ways such as annealing at high temperature of more than 600° C. under hydrogen atmosphere or ion-implantation. By using a plasma enhanced silicon nitride film as the silicon nitride film, addition of hydrogen and confinement of hydrogen can simultaneously be carried out.

Figure 3:
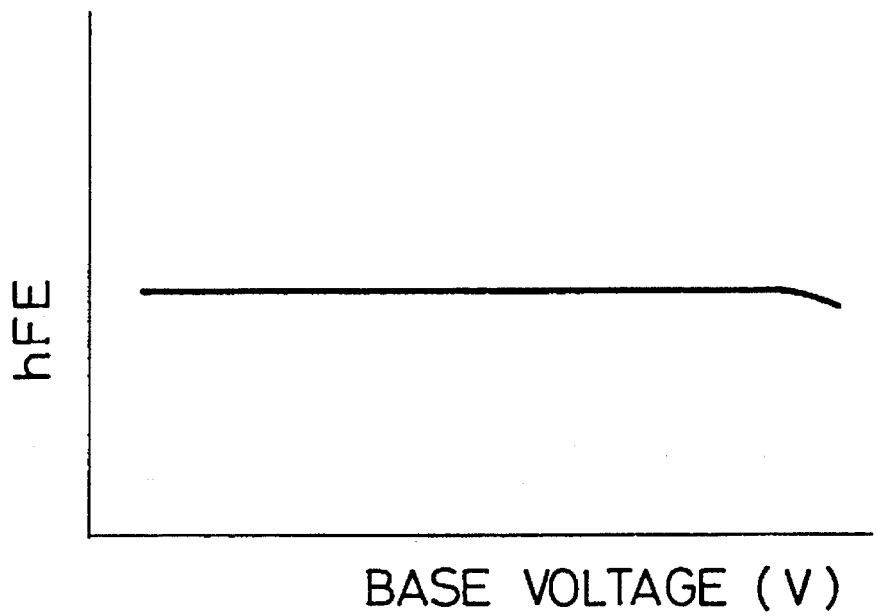
FIG. 3 is a chart showing the emitter-base voltage dependency of the hFE of the inventive phototransistor.
Figure 4:
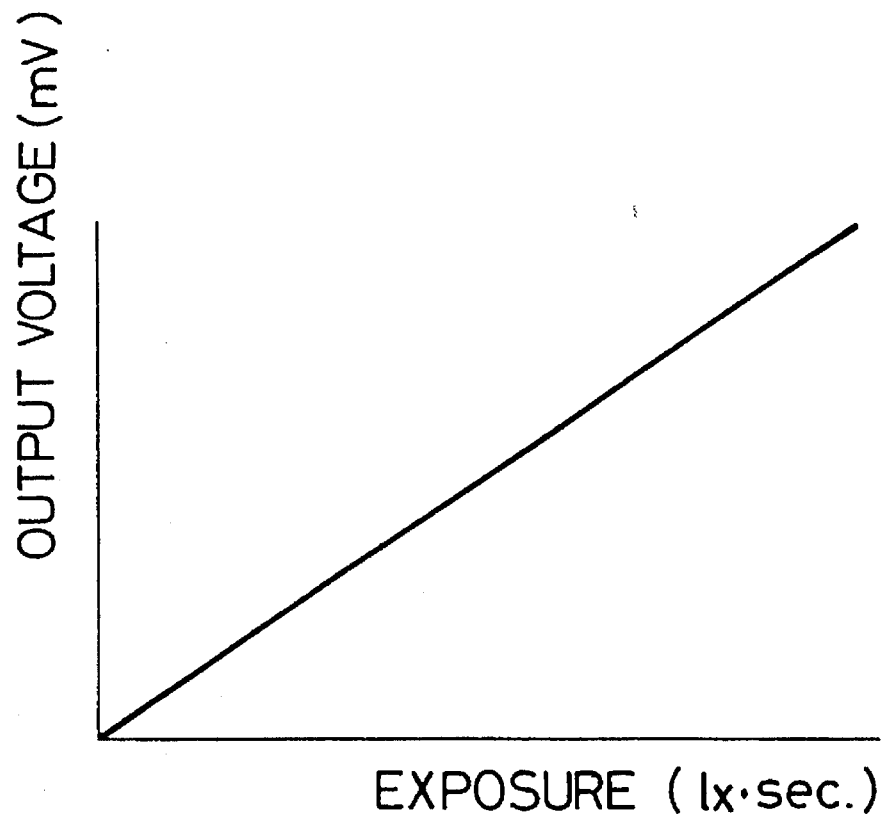
FIG. 4 is a chart showing the photoelectric transfer characteristic which is observed when the inventive phototransistor is used.
Figure 5:
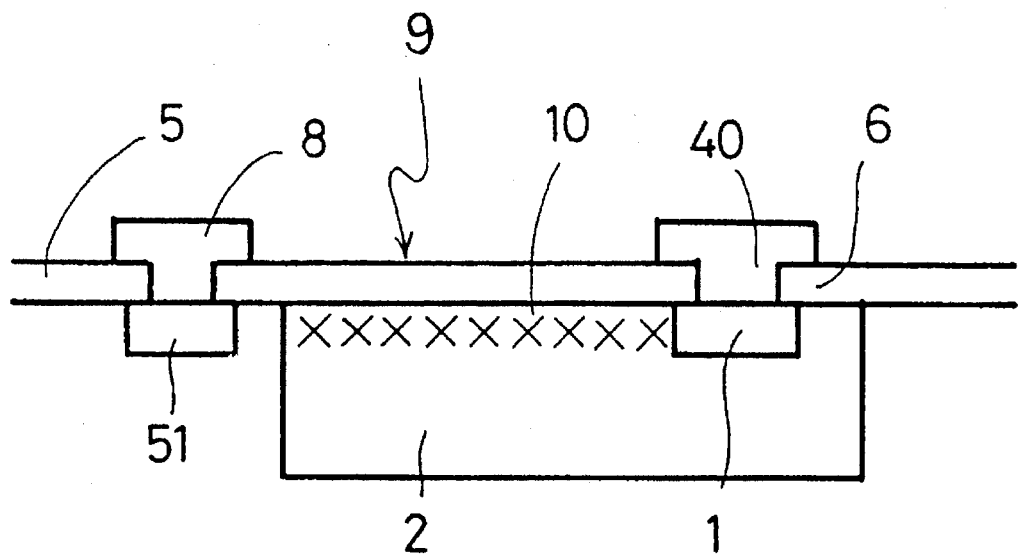
FIG. 5 is a sectional view of the conventional phototransistor.
Figure 6:
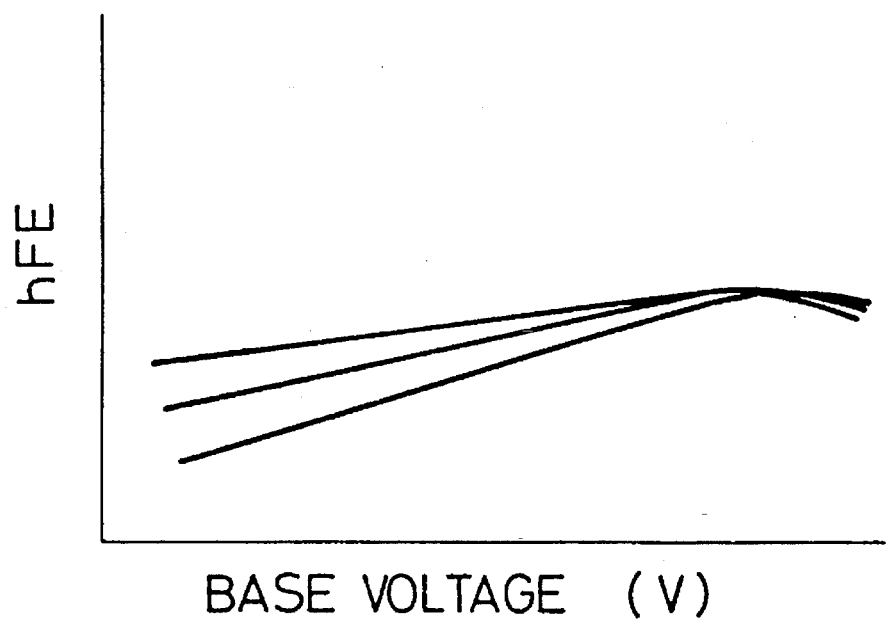
FIG. 6 is a chart showing the emitter-base voltage dependency of the hFE of the conventional phototransistor.
Figure 7:
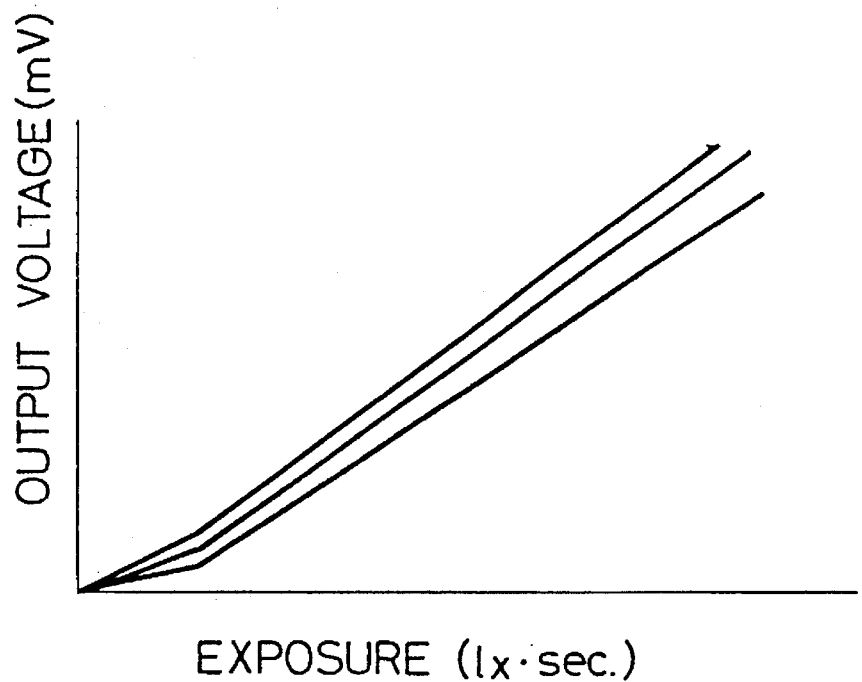
FIG. 7 is a chart showing the photoelectric transfer characteristic which is observed when the conventional phototransistor is used.

In FIG. 3, there is shown the hFE-base voltage characteristic of the inventive photosensor. According to the FIG. 3, the emitter-base voltage dependency of the hFE is low. Further, the hFE scarcely fluctuates among different devices. FIG. 4 shows the photoelectric transfer characteristic of the inventive phototransistor, and the linearity of the photoelectric transfer is high. Moreover, the photoelectric transfer is almost constant even in different devices.

Each of the high impurity concentration base region 30, the gate electrode 20, and the cover of plasma nitride film 7 is effective if used either in combination or alone.

As mentioned above, the object of the present invention is to obtain stably the reproducibility of the exposure and the output voltage and the linearity of the photoelectric transfer characteristic because the base surface is stable, and the hFE does not fluctuate nor depend on the base voltage.

I claim:

1. A photosensor comprising:

a semiconductor substrate;

a bipolar phototransistor formed in a surface portion of the semiconductor substrate, the bipolar phototransistor having an emitter region, a base region, and a collector region which constitutes the semiconductor substrate, the emitter region being formed in a first surface portion of the base region, and the base region being formed in a surface portion of the collector region;

a region of high impurity concentration formed in a second surface portion of the base region and spaced from the emitter region formed in the first surface portion of the base region, the emitter region being surrounded by the region of high impurity concentration, and the region of high impurity concentration having the same conductivity type as that of the base region and a higher concentration than that of the base region;

a silicon dioxide film formed on the bipolar phototransistor, the silicon dioxide film having an upper surface and a sidewall surface; and an electrode formed in the silicon dioxide film a over a peripheral part of the emitter region, the peripheral part of the emitter region being formed in a third surface portion of the base region and between the region of high impurity concentration and the emitter region, and the emitter region being surrounded by the electrode which is maintained at a constant potential or a floating potential.

2. A photosensor comprising:

a semiconductor substrate;

a bipolar phototransistor formed in a surface portion of the semiconductor substrate, the bipolar phototransistor having an emitter region, a base region, and a collector region which constitutes the semiconductor substrate, the emitter region being formed in a first surface portion of the base region, and the base region being formed in a surface portion of the collector region;

a region of high impurity concentration formed in a second surface portion of the base region and spaced from the emitter region formed in the first surface portion of the base region, the emitter region being surrounded by the region of high impurity concentration, and the region of high impurity concentration having the same conductivity type as that of the base region and a higher concentration than that of the base region;

a silicon dioxide film formed on the bipolar phototransistor, the silicon dioxide film having an upper surface and a sidewall surface;

an electrode formed in the silicon dioxide film and over a peripheral part of the emitter region, the peripheral part of the emitter region being formed in a third surface portion of the base region and between the region of high impurity concentration and the emitter region, and the emitter region being surrounded by the electrode; and a covering film formed over and completely covering the upper and sidewall surfaces of the silicon dioxide film, the covering film having a smaller diffusion coefficient of hydrogen than that of the silicon dioxide film.

3. A photosensor according to claim 2, wherein the covering film comprises a silicon nitride film.

4. A photosensor comprising:

a semiconductor substrate;

a bipolar phototransistor formed in a surface portion of the semiconductor substrate, the bipolar phototransistor having an emitter region, a base region, and a collector region which constitutes the semiconductor substrate, the emitter region being formed in a first surface portion of the base region, and the base region being formed in a surface portion of the collector region;

a region of high impurity concentration formed in a second surface portion of the base region and spaced from the emitter region formed in the first surface portion of the base region, the emitter region being surrounded by the region of high impurity concentration, and the region of high impurity concentration having the same conductivity type as that of the base region and a higher concentration than that of the base region;

a silicon dioxide film formed on the bipolar phototransistor, the silicon dioxide film having an upper surface and a sidewall surface;

an electrode formed in the silicon dioxide film and over a peripheral part of the emitter region, the peripheral part of the emitter region being formed in a third surface portion of the base region and between the region of high impurity concentration and the emitter region, and the emitter region being surrounded by the electrode which is maintained at a constant potential or a floating potential; and a covering film formed over and completely covering the upper and sidewall surfaces of the silicon dioxide film, the covering film having a smaller diffusion coefficient of hydrogen than that of the silicon dioxide film.

5. A photosensor according to claim 4, wherein the covering film comprises a silicon nitride film.

6. A photosensor comprising:

a semiconductor substrate;

a bipolar phototransistor formed in a surface portion of the semiconductor substrate, the bipolar phototransistor having an emitter region, a base region, and a collector region which constitutes the semiconductor substrate, the emitter region being formed in a first surface portion of the base region, and the base region being formed in a surface portion of the collector region;

a region of high impurity concentration formed in a second surface portion of the base region and spaced from the emitter region formed in the first surface portion of the base region, the emitter region being surrounded by the region of high impurity concentration, and the region of high impurity concentration having the same conductivity type as that of the base region and a higher concentration than that of the base region;

a silicon dioxide film formed on the bipolar phototransistor, the silicon dioxide film having an upper surface and a sidewall surface;

a wiring covering a part of the upper surface and the sidewall surface of the silicon dioxide film;

an electrode formed in the silicon dioxide film and over a peripheral part of the emitter region, the peripheral part of the emitter region being formed in a third surface portion of the base region and between the region of high impurity concentration and the emitter region, and the emitter region being surrounded by the electrode which is maintained at a constant potential or a floating potential; and a covering film formed on the wiring and the silicon dioxide film, the covering film completely covering another part of the upper surface of the silicon dioxide film, and the covering film having a smaller diffusion coefficient of hydrogen than that of the silicon dioxide film.

7. A photosensor according to claim 6; wherein the wiring comprises a collector electrode of the collector region.

8. A photosensor according to claim 6; wherein the covering film comprises a silicon nitride film.

* * * * *